(12) United States Patent
Bonen (10) Patent No.: US 10,715,170 B1
(45) Date of Patent: Jul. 14, 2020

(54) INCREASING THE DYNAMIC RANGE OF A DIGITAL TO ANALOG CONVERTER (DAC)

(71) Applicant: Harmonic, Inc., San Jose, CA (US)

(72) Inventor: Adi Bonen, Belle Mead, NJ (US)

(73) Assignee: Harmonic, Inc., San Jose, CA (US)

( * ) Notice: Subject to any disclaimer, the term of this patent is extended or adjusted under 35 U.S.C. 154(b) by 0 days.

(21) Appl. No.: 16/410,721

(22) Filed: May 13, 2019

Related U.S. Application Data

(60) Provisional application No. 62/672,298, filed on May 16, 2018, provisional application No. 62/803,174, filed on Feb. 8, 2019.

(51) Int. Cl.
    *H03M 1/70*     (2006.01)
    *H03G 3/30*     (2006.01)

(52) U.S. Cl.
    CPC ............ *H03M 1/70* (2013.01); *H03G 3/3005* (2013.01); *H03G 3/3089* (2013.01)

(58) Field of Classification Search
    CPC ...... H03M 1/70; H03G 3/3089; H03G 3/3005
    USPC .................................................. 341/144, 120
    See application file for complete search history.

(56) References Cited

U.S. PATENT DOCUMENTS

| | | | | |
|---|---|---|---|---|
| 6,462,689 | B2 * | 10/2002 | Wong ..................... | H03M 3/50 341/139 |
| 7,450,047 | B1 * | 11/2008 | Wu ........................ | H03M 3/412 341/143 |
| 7,557,743 | B2 * | 7/2009 | Imai ..................... | H03M 1/0604 341/117 |
| 8,362,936 | B2 * | 1/2013 | Ledzius .................. | H03M 1/70 341/139 |

* cited by examiner

*Primary Examiner* — Brian K Young
(74) *Attorney, Agent, or Firm* — Christopher J. Brokaw; Brokaw Patent Law PC (57) ABSTRACT

Increasing a dynamic range of a digital to analog converter (DAC). A signal analysis element is positioned prior to the DAC in a processing path. The element evaluates an instantaneous amplitude of a signal to be applied to the DAC. The DAC is capable of a first full scale value. An additional current source supports a second full scale value of the DAC, which is greater than the first full scale value. Upon the element determining that a condition is not satisfied, the element employs current steering to couple the additional current source to a current sink. However, upon the element determining that the condition is satisfied, the element employs current steering to couple the additional current source to an output of the DAC to support the second full scale value of the DAC.

20 Claims, 13 Drawing Sheets

INCREASING THE DYNAMIC RANGE OF A DIGITAL TO ANALOG CONVERTER (DAC)

CLAIM OF PRIORITY

The present application claims priority to U.S. Provisional Patent Application No. 62/672,398, entitled 'Increasing DAC Dynamic Range for Conversion of Large PAPR Signals,' invented by Adi Bonen, filed on May 16, 2018, the entire disclosure of which is hereby incorporated by reference in its entirety for all purposes as if fully set forth herein.

The present application also claims priority to U.S. Provisional Patent Application No. 62/803,174, entitled 'Increasing DAC Dynamic Range for Conversion of Large PAPR Signals,' invented by Adi Bonen, filed on Feb. 8, 2019, the entire disclosure of which is hereby incorporated by reference in its entirety for all purposes as if fully set forth herein.

FIELD OF THE INVENTION

Embodiments of the invention generally relate to increasing the dynamic range of a digital to analog converter (DAC).

BACKGROUND

In a typical communications device, the peak voltage of a pure continuous wave (CW) signal is only $\sqrt{2}$ higher than its average (root mean square or RMS) voltage, exhibiting PAPR (peak to average power ratio, expressed in dB) of 3 dB. A signal composed of N independent equal amplitude CW's has a maximum peak value of $N \times \sqrt{2}$ of the average value of one CW, and an RMS value of $\sqrt{N}$ times the single CW average value. Thus, the maximum PAPR of that signal is $20 \times \log 10(N \times \sqrt{(2/N)}) = 10 \times \log 10(N) + 3$ dB. PAPR increases logarithmically with the number of CW's.

The probability for encountering the high peak value is extremely small. For example, if N=30, the max PAPR could be ~18 dB, but the probability that the peak of all independent CWs will align within ±5 degrees is $(10/360)^{30} = 2 \times 10^{-47}$.

When a RF signal is composed of multiple QAM carriers, the same equation can be used by using a single QAM carrier PAPR to replace the 3 dB of a CW PAPR. In order to quantify a "reasonable to occur" PAPR value, an evaluation of the rate at which the signal is sampled vs. the expected wait time is performed. For example, at a sample rate of 5 Gsps, $5 \times 10^9$ samples will be taken every second, making it very likely that a probability of $10^{-7}$ will occur every second, but very unlikely that a probability of $10^{-13}$ will occur every second.

The signal spectrum of several types of broadband communication schemes (such as wireless, cellular, WiFi, and CATV) is composed of deep modulation carriers (such as QAM and OFDM). Often, that spectrum is composed of multiple deep modulation carriers. As a result, the RF signal over these media suffers from high PAPR. High PAPR signals exhibit occasional very high instantaneous amplitude peaks which are much higher than the signal average value. Evaluating the nature of a typical CATV signal, a reasonably occurring peak (about once every second) can be ~17 dB. While the probability of such very high peak levels is very low, the probability of lower peak values increases. For example, for the same signal, the probability goes up to $10^{-4}$ (average occurrence of once every ~2 microseconds) for PAPR of about 12 dB.

Figure 1:
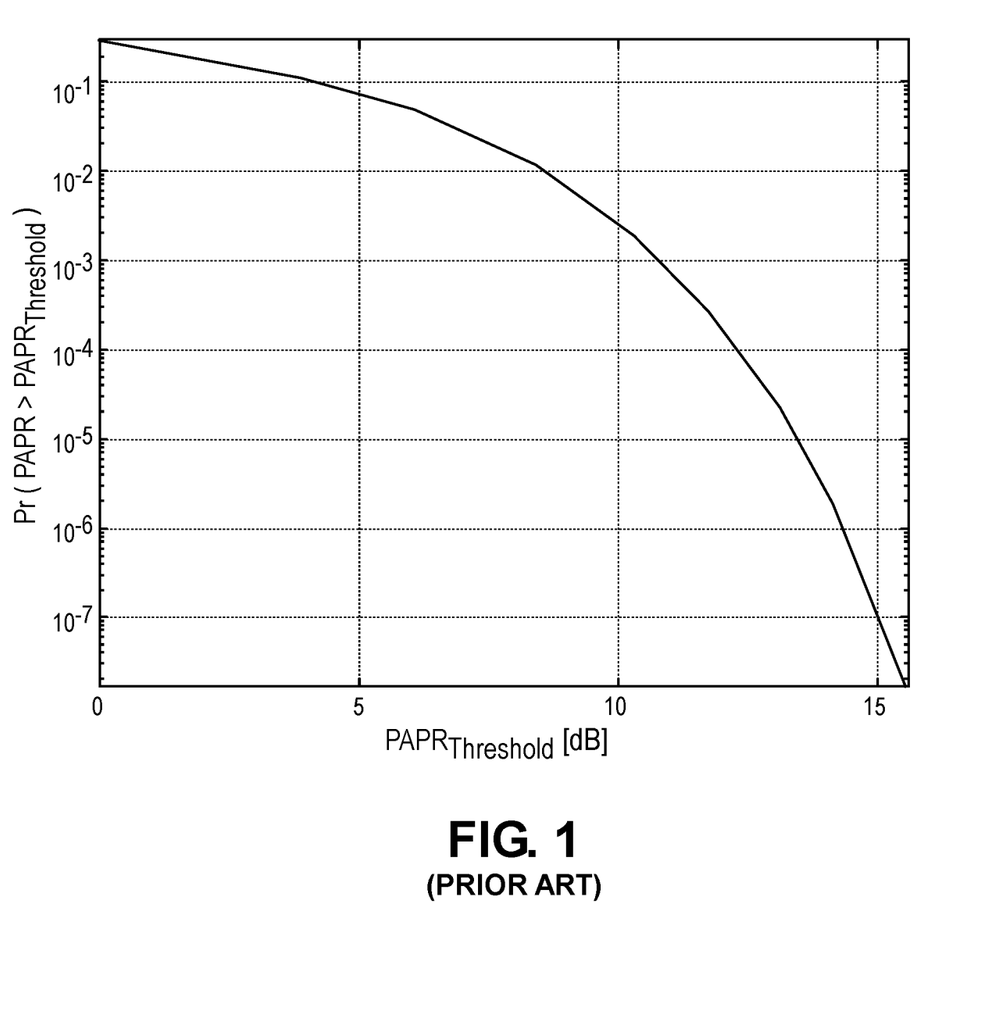
FIG. 1 is a graph that illustrates a PAPR plot for a typical CATV signal composed of 128×6 MHz channels of 256-QAM modulation in accordance with the known art.

It is customary to plot PAPR probability of a certain signal in a graph where the X-axis represents $PAPR_{Threshold}$, and the Y-axis represent the probability of any PAPR higher than that $PAPR_{Threshold}$. FIG. 1 is a graph that illustrates a PAPR plot for a typical CATV signal composed of 128×6 MHz channels of 256-QAM modulation in accordance with the known art.

The design of a communication device has to consider the expected PAPR values and their probability by allowing reasonably high instantaneous peaks to be processed with no or minimal distortion by the various components in the signal path. For example, a back off of ~17 dB is typically used in a DAC (digital to analog converter) processing a broadband CATV signal. In other words, the average (RMS) voltage of the signal is set to be ~17 dB below the DAC full scale (the maximum signal amplitude that can be handled by the DAC).

Figure 2:
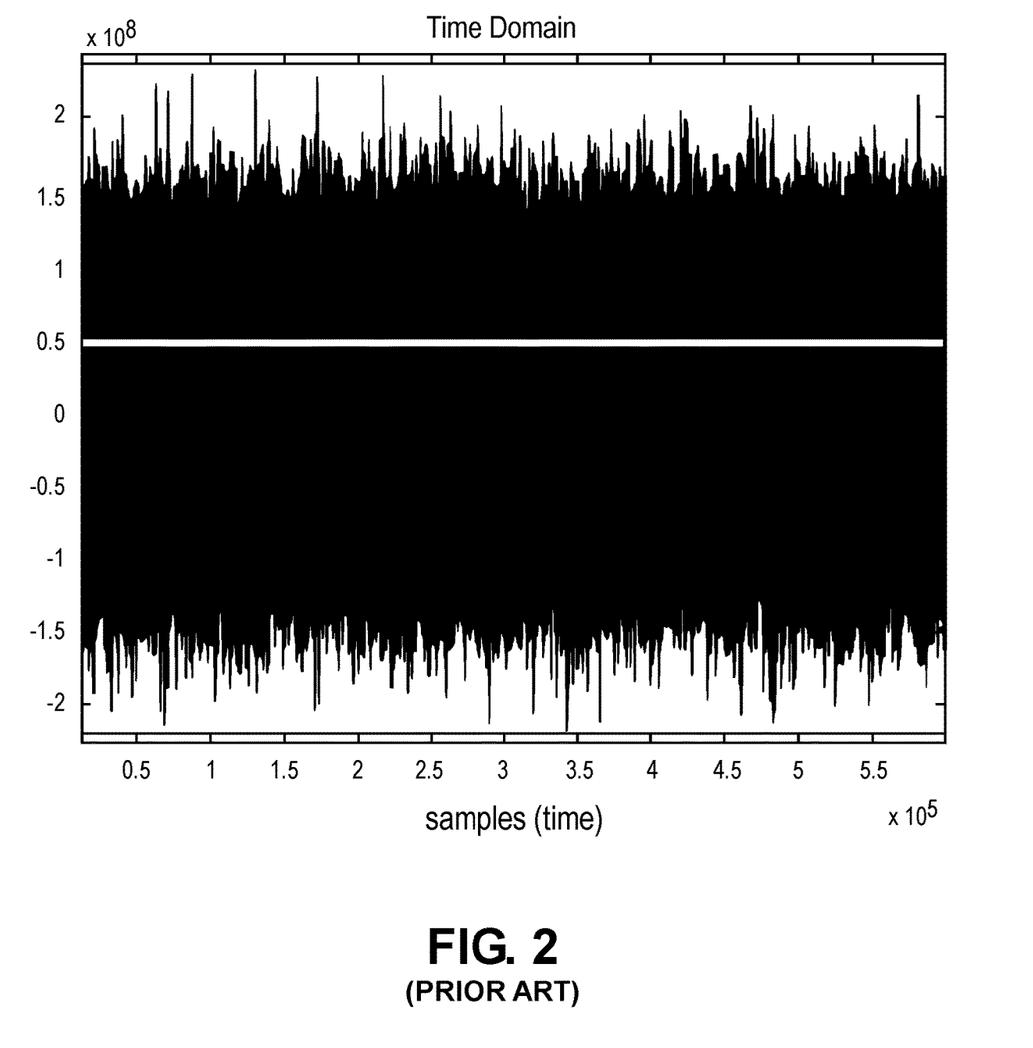
FIG. 2 is a time domain linear plot of a typical CATV(t) signal composed of 128×6 MHz channels of 256-QAM modulation in accordance with the known art.

FIG. 2 is a time domain linear plot of a typical CATV(t) signal composed of 128×6 MHz channels of 256-QAM modulation in accordance with the known art. FIG. 2 depicts about 600,000 samples of the 768 MHz broad signal sampled at about 2.5 Gsps. Note that the signal has both positive and negative peaks.

Figure 3:
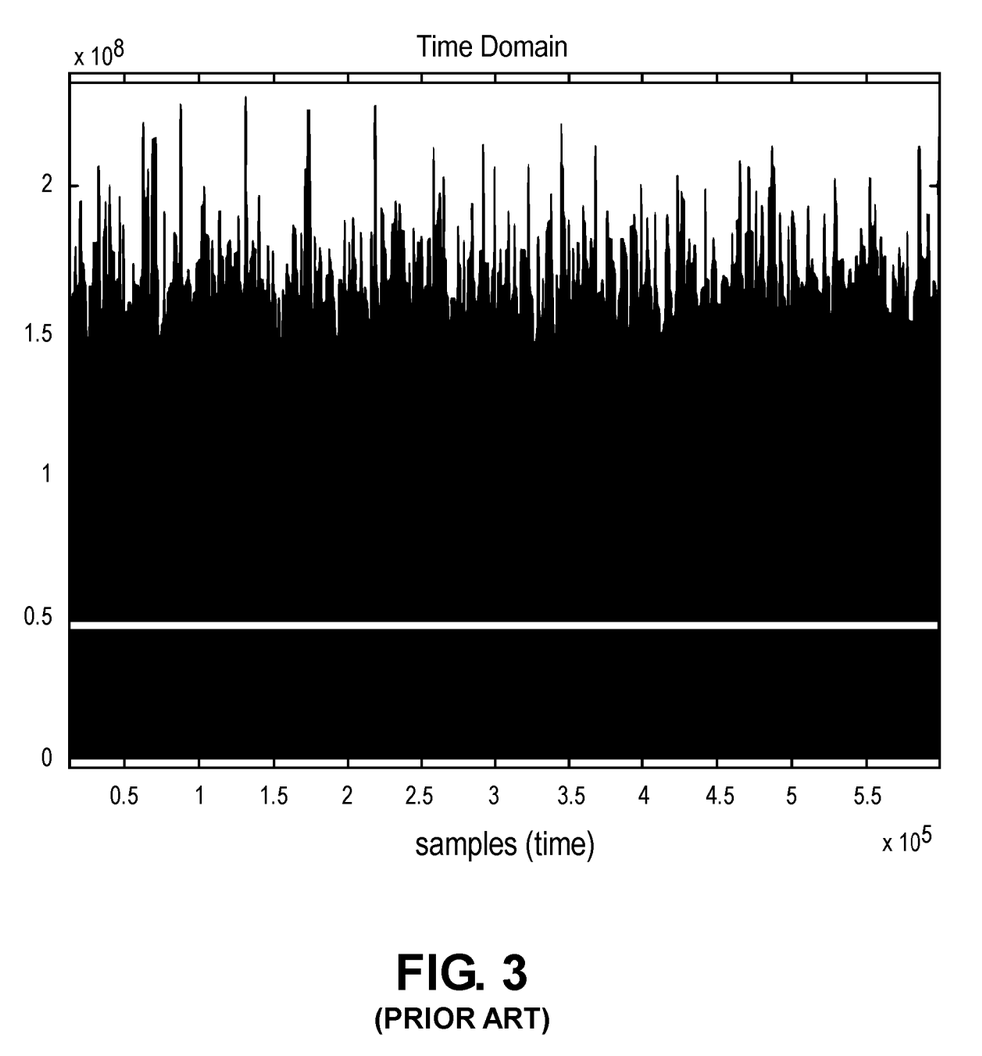
FIG. 3 is an absolute linear value plot of the same signal as shown in FIG. 2, namely ABS(CATV(t)), in accordance with the known art.
Figure 4:
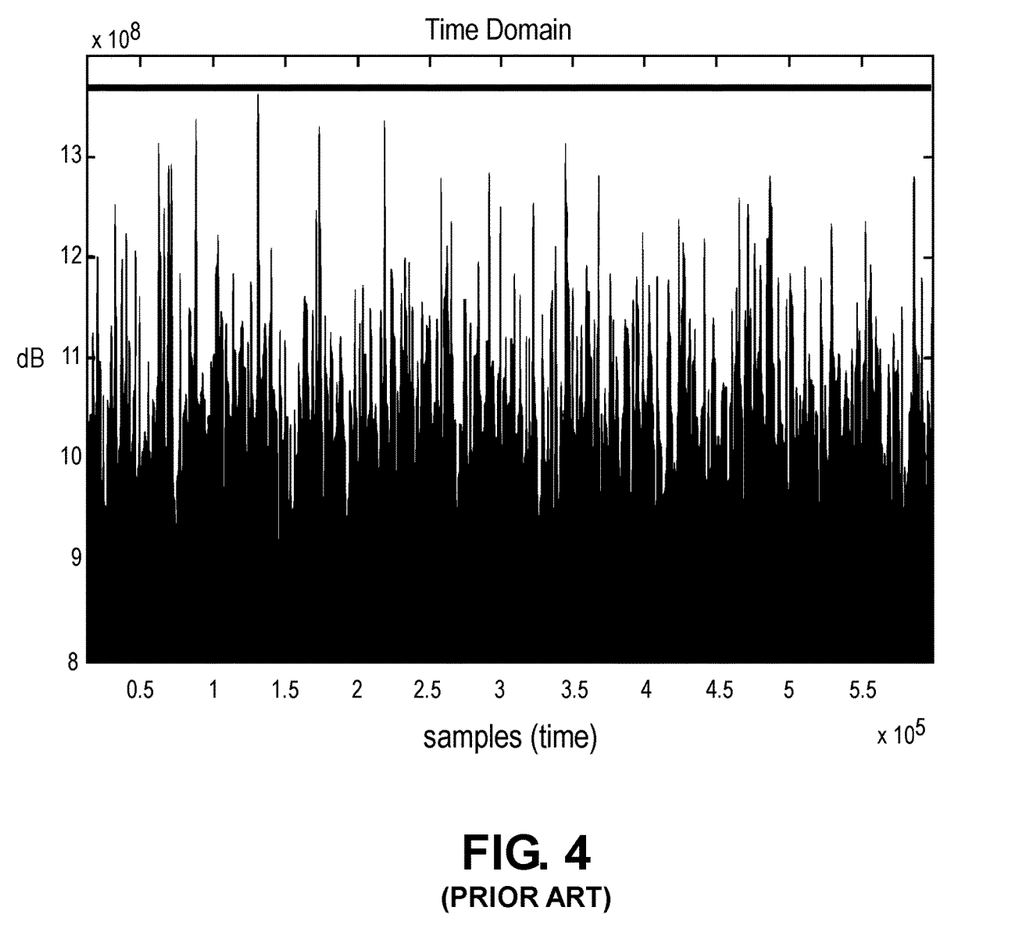
FIG. 4 is a plot of the same signal as shown in FIG. 2 in logarithmic scale, namely 20*log 10(ABS(CATV(t))), scaled with the RMS value at 0 dB, in accordance with the known art.

FIG. 3 is an absolute linear value plot of the same signal as shown in FIG. 2, namely ABS(CATV(t)), in accordance with the known art. FIG. 4 is a plot of the same signal as shown in FIG. 2 in logarithmic scale, namely 20*log 10(ABS(CATV(t))), scaled with the RMS value at 0 dB, in accordance with the known art.

Figure 5:
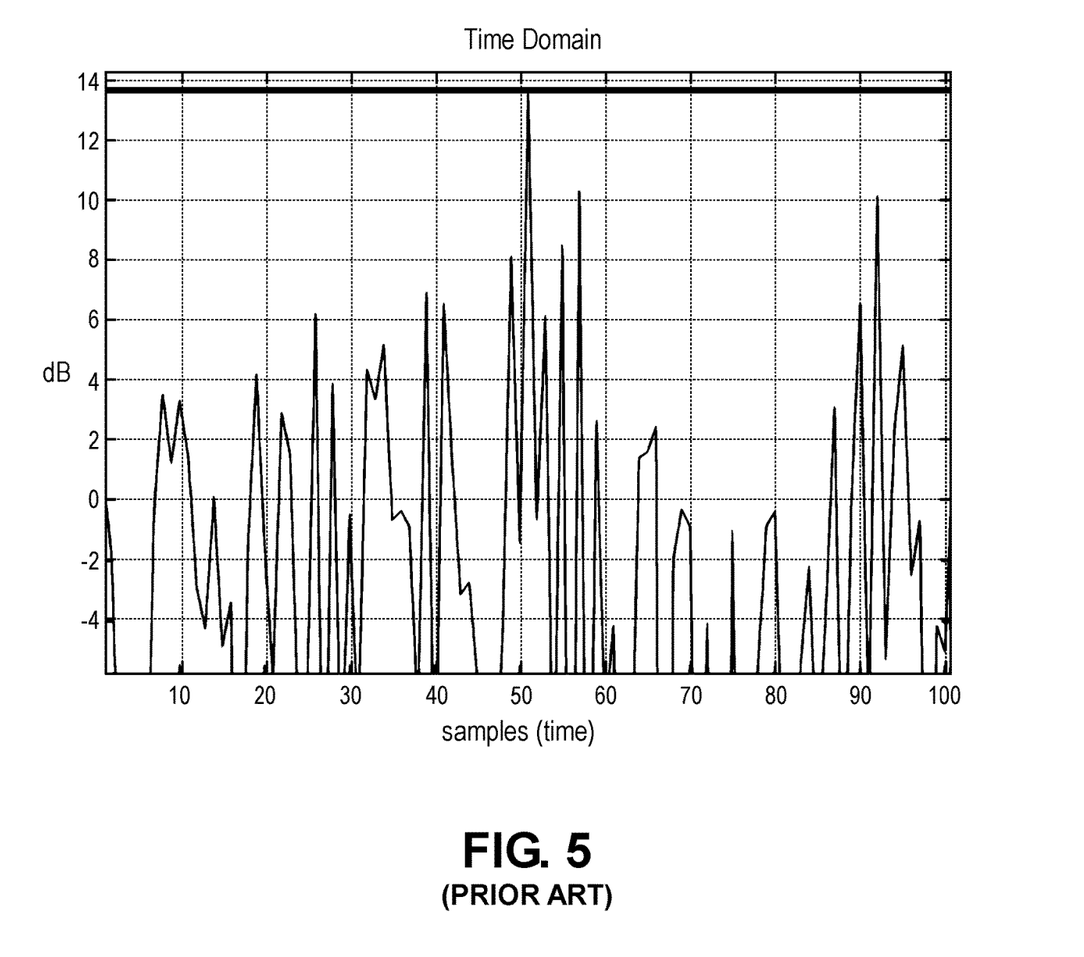
FIG. 5 is a chart depicting the 100 samples immediately near the highest PAPR recorded in the same signal as shown in FIG. 2 in accordance with the known art.

FIG. 5 is a chart depicting the 100 samples immediately near the highest PAPR recorded in the same signal as shown in FIG. 2 in accordance with the known art. As suggested by FIG. 5, it is typical to find several other peaks not far in value near a very high instantaneous peak. For example, in FIG. 5, two additional high peaks of just about 4 dB lower than the very high ~14 dB peak are experienced in the signal very close to the very high ~14 dB peak value.

Any practical DAC has a limited dynamic range, and thus it introduces noise and distortions to the signal it reconstructs from samples. Such noise and distortion may be described or characterized through various parameters such as ACLR (adjacent channel leakage ratio), SFDR (spurious free dynamic range), ENOB (effective number of bits), and the like. While the largest possible dynamic range is desirable to reduce noise and distortions, in practice the dynamic range is limited due to power consumption, cost, the available technology, and other constraints. Typically, the digital signal samples applied to the DAC are adjusted (by applying a digital gain) in their amplitude such that the average power value is sufficiently below the full scale of the DAC. That adjustment typically targets a certain probability for the signal PAPR peak to be higher than the DAC full scale. In addition, the signal is typically clamped before being applied to the DAC such that if a PAPR value higher than the DAC full scale does occur, a value equal to the DAC full scale is replacing the actual signal value. This replacement prevents a digital "wrap around" effect and ensures that the DAC creates an analog signal which is as close as possible to the original high PAPR peak value.

When a very high PAPR sample value occurs, which is above the full scale of the DAC, an error is introduced to the recreated analog signal at the output of the DAC. The clamping operation reduces the error amplitude (relative to a wraparound implementation). However, such an error, which typically is limited to a single DAC sample, is a real concern in a communication device. Being similar to a Dirac Delta or an impulse noise, the nature of such an error is that it manifests itself as a wide band noise that spreads over the in band operating bandwidth of the communicating device and can only be restricted in frequency by also affecting the out of band frequency range by analog blocking filters. The need to prevent these low probability peaks from creating noise events in band and out of band is the main motivation in setting the digital signal value such that the signal RMS level is set at a large back-off level relative to the DAC full scale.

However, given that the DAC dynamic range is limited, the higher the RMS signal back-off is from the DAC full scale, the closer is the RMS signal level to the noise level generated by the DAC. Thus, typically an optimization is implemented to compromise between the low probability of a large PAPR value exceeding the DAC full scale (and creating a short duration broadband noise event) and the overall "continuous noise floor" of the analog signal.

It is very desirable to increase the DAC dynamic range to enable handling very high large PAPR signals while keeping the DAC noise floor very low relative to the RMS signal value. However, there exist limitations in the available technology to achieve such a goal. Given a certain semiconductor technology, there is a steep trade off in energy efficiency (power consumption) to achieve even just a small increase in DAC dynamic range.

Modern high sample rate DAC implementations often use a current steering scheme. In such a scheme, a multitude of switched current elements are used, where each element is typically composed of a constant current source, a current steering switch, and optionally a current sink. Each current diversion switch is controlled by a logical signal, which is obtained from the sample to be processed by the DAC, to steer the current source to either the DAC output or to the current sink. Some implementations use the current diversion switch to divert the current between two separate outputs of the DAC (those being the positive and the negative outputs). This scheme is superior in accuracy relative to a scheme in which the current sources are directly turned on or off by the logical signal. This is so because current steering can be much faster than turning the current source on or off and because current steering is much less prone to a memory effect, where the current applied to the output load at one sample is affected by the current applied to the load during previous samples. Since the current sources of a current steering DAC are always on, its power consumption is relatively constant.

Figure 6:
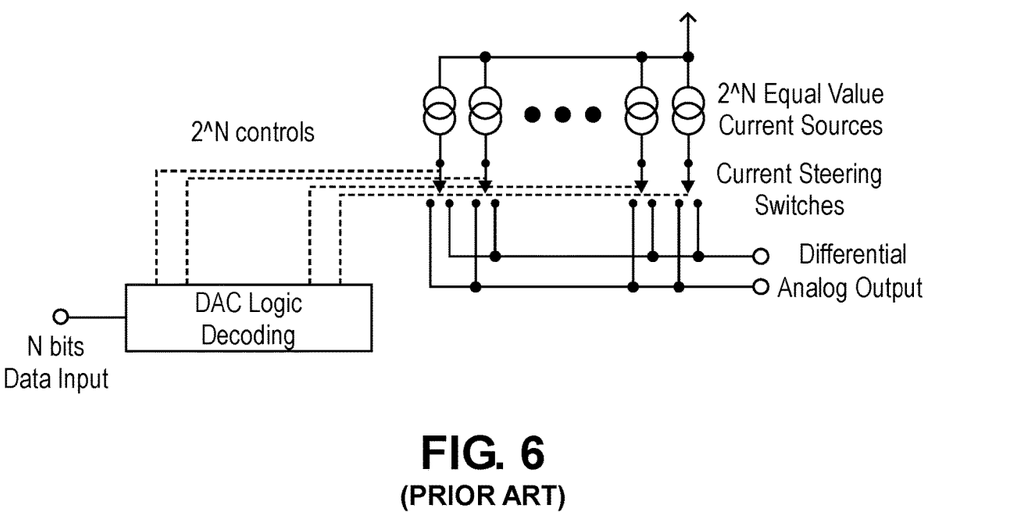
FIG. 6 is a simplified binary power DAC implementation used to process wide bandwidth signals in accordance with the known art.

DACs used to process wide bandwidth signals are required to operate at high sample rate while possessing high dynamic range, and thus require a large number of effective bits. FIG. 6 is a simplified binary power DAC implementation used to process wide bandwidth signals in accordance with the prior art.

The simplified DAC implementation of FIG. 6 has a binary structure of current sources, where N current sources are arranged such that any successive current source has twice the current of its predecessor. Such a structure can handle a signal range of $2^N$ digital values. The DAC performance, and its dynamic range, is limited by the accuracy of these current sources. For example, a 1% error in the current of the most significant current source is about 10 times larger than the current value of the $11^{th}$ current source. Thus, small inaccuracies in the values of current sources, especially the larger value current sources, may limit the total accuracy and the dynamic range of the whole DAC. Fortunately, while the absolute current of each current source is hard to control in a typical semiconductor manufacturing process, the relative accuracy of such sources is much more controllable. Here, relative accuracy refers to the difference between the intended and actual ratios between these sources current. Nevertheless, achieving such high relative accuracy enabling large dynamic range very fast DACs with effective number of bits of 10 and above is still a great challenge.

Figure 7:
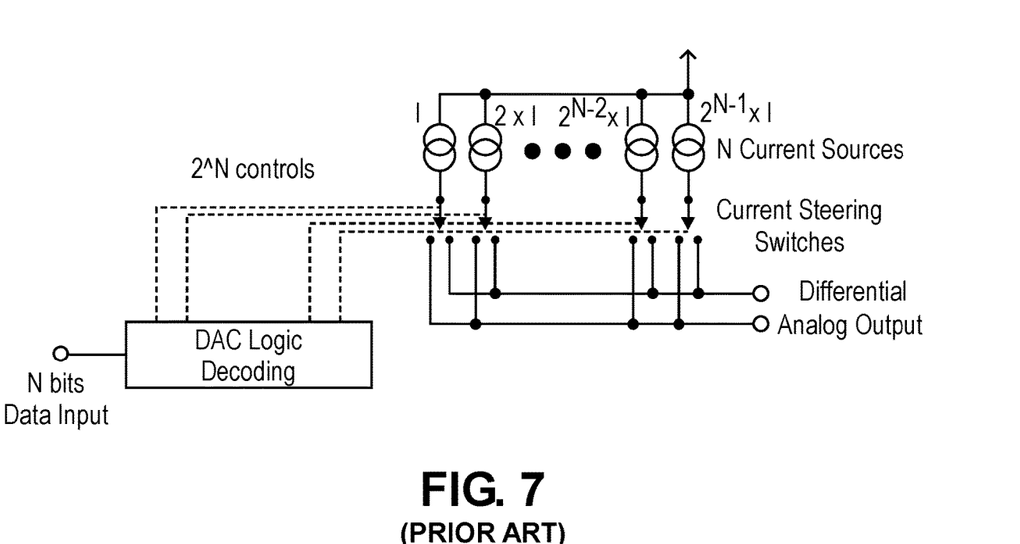
FIG. 7 is an illustration of a DAC implementation having $2^N$ equal value current sources to create a $2^N$ signal range in accordance with the known art.

FIG. 7 is an illustration of a DAC implementation having $2^N$ equal value current sources to create a $2^N$ signal range in accordance with the known art. The DAC of FIG. 7 requires a single "standard" current source and can result in a very repeatable and accurate DAC. However, the DAC implementation of FIG. 1 is often very expensive (in silicon real estate) due to the large number of current sources required to implement large N values as required for large dynamic range signals.

Figure 8:
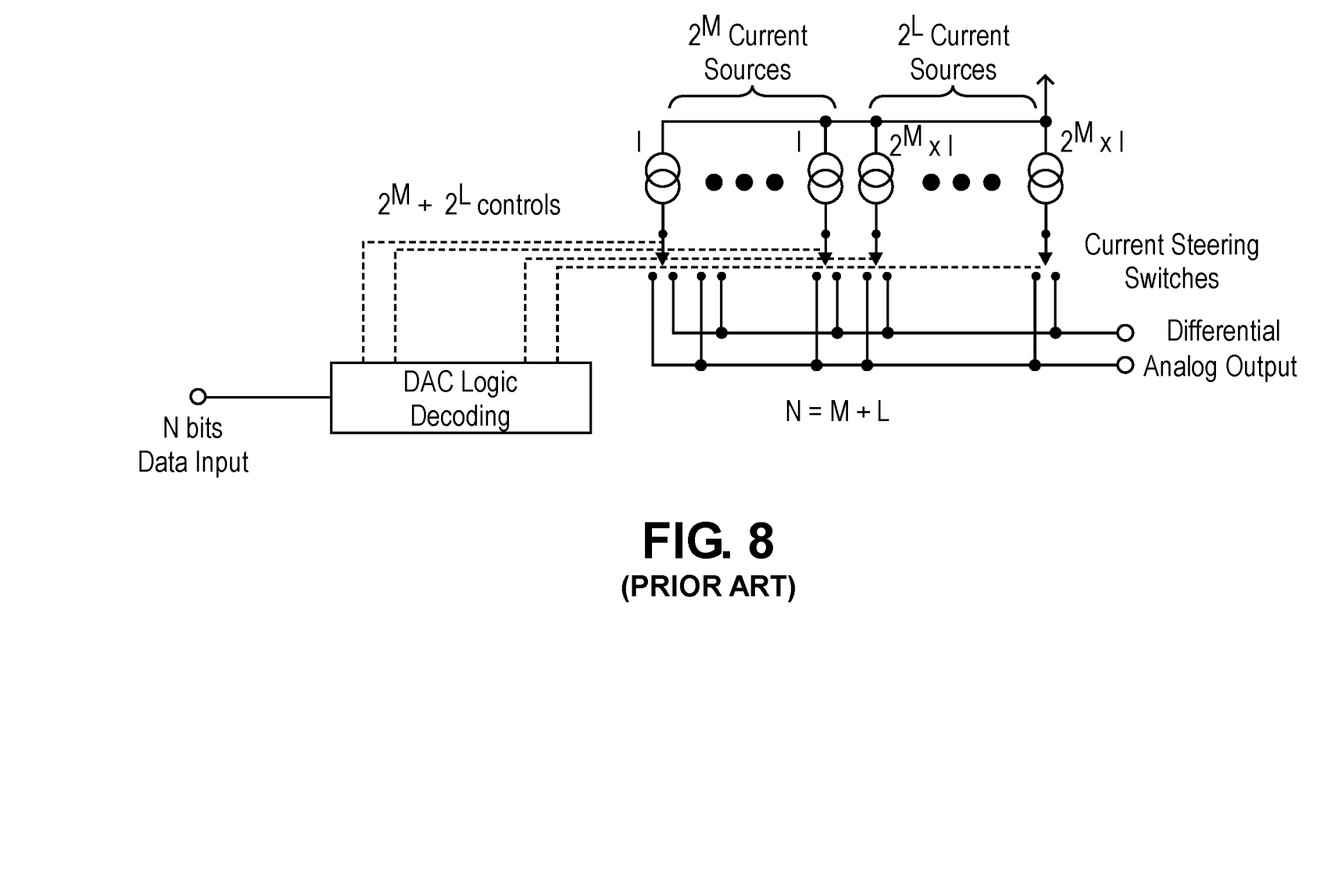
FIG. 8 is an illustration of a hybrid approach DAC implementation having a small number of current source values combined together in accordance with the known art.

Due to practical reasons, the construction of high speed large dynamic range DACs often relies on a hybrid approach, where a small number of current source values (typically 2 or 3) is combined together to construct the DAC. Such a hybrid approach is shown in FIG. 8, which is an illustration of such a hybrid approach DAC implementation having a small number of current source values combined together in accordance with the known art.

If 2 current source values are used, M current sources of the smaller value I are in a first group and L (L=N−M) current sources of the larger value $2^M \times I$ are in the second group. For example, an 11 bit DAC can be constructed of 64 current sources of the value I, and 32 current sources of the value 64×I. The achievable relative accuracy of these sources is such that better accuracy and dynamic range is possible than in a binary power DAC composed of 11 current sources, while the total number of current sources in the hybrid DAC (96) is much smaller than in a "flat 11-bit DAC" requiring 2048 current sources. Similarly, a 3-group DAC can be constructed as well.

Note that the power consumption required by each current source is proportional to its set current value. Adding a 0.5×LSB (least significant bit) current source may be insignificant from a power consumption point of view, but it will also not benefit accuracy and dynamic range if the resulting signal is below the DAC noise floor. Adding a 2×MSB (most significant bit) current source may practically result in doubling the power consumption of the DAC. Such a 2×MSB current source will typically result in insignificant increase in the overall DAC accuracy and dynamic range since the relative accuracy of this 2×MSB current source (its accuracy relative to the lower value current sources) will likely become the limiting factor in the overall DAC accuracy).

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for increasing a dynamic range of a digital to analog converter (DAC) are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Embodiments of the invention are directed towards extending the dynamic range of a digital to analog converter (DAC) using a current source that is employed on an as-needed basis Embodiments may be used in a variety of different technical contexts and have particular utility in use within a communications device.

Figure 9:
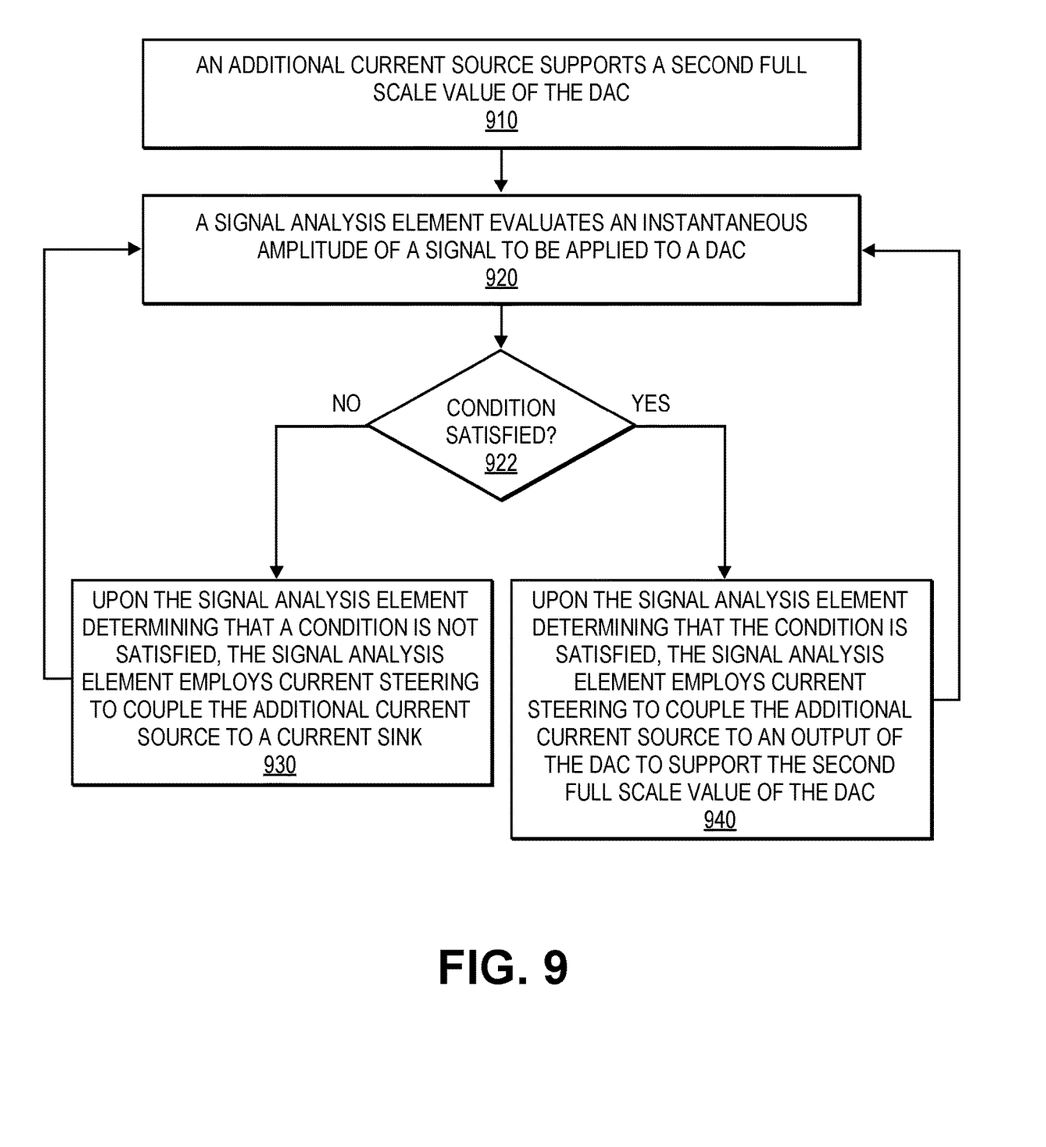
FIG. 9 is a flowchart illustrating the steps of increasing the dynamic range of a digital to analog converter (DAC) in accordance with an embodiment of the invention.

FIG. 9 is a flowchart illustrating the steps of increasing the dynamic range of a digital to analog converter (DAC) in accordance with an embodiment of the invention. The explanation of the steps of FIG. 9 will be described below with reference to FIG. 10, which depicts a DAC on which an embodiment of the invention may be practiced.

Figure 10:
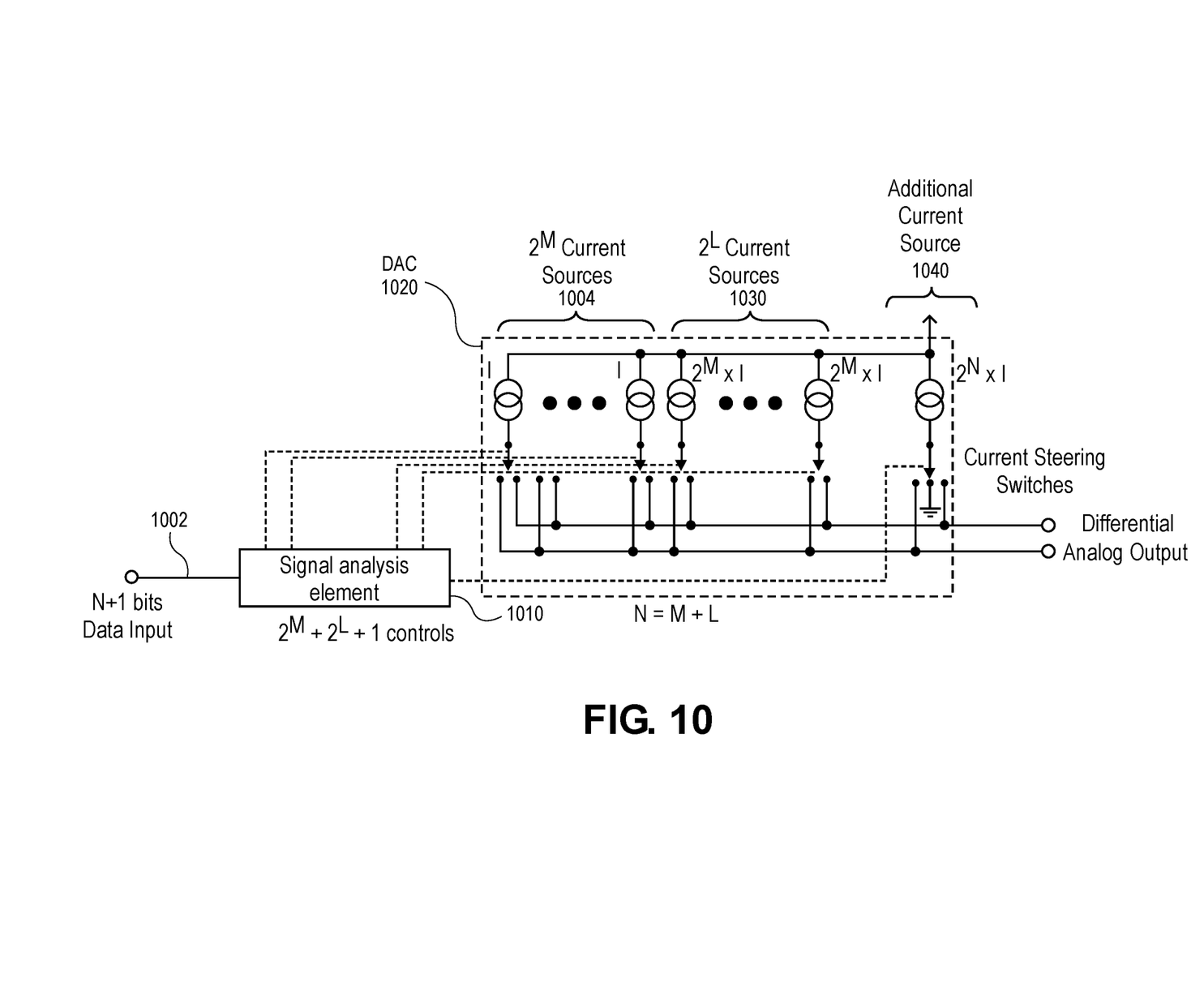
FIG. 10 is a block diagram of a signal analysis element and a DAC in accordance with an embodiment of the invention.

DAC 1020 of FIG. 10 broadly represents a digital to analog converter that supports a first full scale value when using $2^M$ current sources 1004 and $2^L$ current sources 1030. The steps of FIG. 9 describe an approach for using an additional current source enabling DAC 1020 to support a second full scale value of the DAC that is greater than the first full scale value of the DAC. Advantageously, embodiments enable the dynamic range of DAC 1020 to be increased while keeping the noise floor of DAC 1020 very similar to that of a DAC without an additional current source.

In step 910 of FIG. 9, additional current source 1040 is employed to support a second full scale value of DAC 1020. Additional current source 1040 may correspond to a 2×MSB higher value current source, although other values of current sources may be employed by embodiments. The second full scale value of the DAC may be about twice the magnitude of the first full scale value of the DAC, although other embodiments may implement other differences in magnitude. Note that step 910 is performed continuously throughout the performance of the steps of FIG. 9.

With reference to FIG. 10, the first full scale value of DAC 1020 is supported by the combination of $2^M$ current sources 1004 and $2^L$ current sources 1030, and the second full scale value of DAC 1020 is supported by the combination of $2^M$ current sources 1004, $2^L$ current sources 1030, and additional current source 1040.

In step 920 of FIG. 9, signal analysis element 1010 evaluates an instantaneous amplitude of a signal 1002 to be applied to DAC 1020. As shown in FIG. 10, signal analysis element 1010 is positioned prior to DAC 1020 in a processing path. In performing step 920, signal analysis element 1010 evaluates an instantaneous amplitude of a signal received over data input 1002.

Signal analysis element 1010 may evaluate the instantaneous amplitude of the signal to be applied to DAC 1020 in a variety of manners. As an example, in one embodiment, signal analysis element 1010 may include or correspond to a comparator of the absolute signal amplitude to a reference value. As such, signal analysis element 1010 may, in step 920, evaluate whether the instantaneous amplitude of the signal to be applied to DAC 1020 is larger than the reference level.

Signal analysis element 1010 may be implemented using a variety of different mechanisms. In an embodiment, signal analysis element 1010 may be implemented using solely hardware mechanisms without software. In another embodiment, signal analysis element 1010 may be implemented, at least in part, using software that executes upon hardware. The behavior of signal analysis element may be configured via a manual configuration or via programmatic means, e.g., based upon a configuration parameters or values defined in a configuration file in which signal analysis element 1010 reads. For example, signal analysis element 1010 may be configured to adjust which specific condition signal analysis element 1010 tests or measures in evaluating the instantaneous amplitude of the signal to be applied to DAC 1020. As another example, a reference value used by signal analysis element 1010 may be a fixed hardware determined value, a value stored in a non-volatile memory inside signal analysis element 1010, or a value supplied to signal analysis element 1010.

In an embodiment, as shown in FIG. 9, after signal analysis element 1010 evaluates the instantaneous amplitude of signal 1002 to be applied to DAC 1020, signal analysis element 1010 determines if a specific condition is satisfied in step 922. To illustrate, the specific condition which signal analysis element 1010 tests or measures in step 922 may correspond to whether a signal sample possesses an absolute value which exceeds the first full scale value of the DAC.

In step 930 of FIG. 9, upon signal analysis element 1010 determining that the condition tested in step 922 is not satisfied, then signal analysis element 1010 employs current steering to couple additional current source 1030 to a current sink 1032.

In step 940 of FIG. 9, upon signal analysis element 1010 determining that the condition tested in step 922 is satisfied, then signal analysis element 1010 employs current steering to couple additional current source 1030 to an output of the DAC to support the second full scale value of the DAC. If DAC 1020 employs two analog outputs, signal analysis element 1010 may also determine to which output to steer the current from additional current source 1040.

After either step 930 or step 940, processing proceeds back to step 920 whereupon signal analysis element 1010 evaluates the next instantaneous amplitude of the signal to be applied to DAC 1020, and the process continues in this fashion so long as the signal is delivered to signal analysis element 1010.

While embodiments of the invention have been chiefly described as signal analysis element 1010 evaluating a single condition in step 922, other embodiments of the invention may be employed where signal analysis element 1010 evaluates a plurality of threshold conditions in step 922. Moreover, when one or more of the plurality of threshold conditions are satisfied in step 922, in an embodiment, signal analysis element 1010 may powers on one or more additional current sources according to the results of evaluating the one or more threshold conditions. For example, two additional current sources, each with a current value of $2^{N-1} \times I$, can be employed, achieving the same dynamic range improvement as a single additional current source with a current value of $2^N \times I$, but potentially achieving other advantages as well.

As shown in FIG. 10, an additional current source of a larger value of $2^N \times I$ is added to DAC 1020. Note that this implementation uses a 3-way current diversion switch. The control of the switch allows the additional current source to be connected to the positive output (doubling the achievable positive amplitude), to the negative output (doubling the achievable negative amplitude), or to a current sink—typically ground (for signal amplitude lower than the original DAC full scale).

Due to semiconductor manufacturing limitations, it is likely that the relative accuracy of the $2^N \times I$ current source is such that the relative error (and output noise) it creates when its current is directed to either the positive or negative DAC outputs is significant when compared to the current of the smaller sources I and $N^M \times I$, and significantly higher than the original DAC noise level.

However, a major advantage of this approach is that the noise generated by the $2^N \times I$ current source while it is connected to the current sink (ground) is negligible—practically zero noise. The $2^N \times I$ current source does add noise to the output of DAC 1020 when instantaneous samples larger than the original full scale are converted to analog by DAC 1020. However, the probability of such samples occurring is very low. At the receiver, these very rare noise events are averaged over time with the much more common zero noise from the $2^N \times I$ current source to produce a very low effective additional noise level, which is typically much lower than the other noise produced by the DAC, and thus practically negligible.

Assuming that the scaling of the input signal is scaled to be 6 dB higher, taking advantage of the possible 6 dB higher output level, the signal RMS level is also increased by 6 dB, enabling an improvement of 6 dB in the signal to noise level at the output of the DAC for all but a few samples. The low probability (of about $10^{-4}$ of the samples) for higher noise level will typically have a negligible decrease in average signal to noise ratio. Thus, overall an increase in dynamic range of almost 6 dB is achieved.

Figure 11:
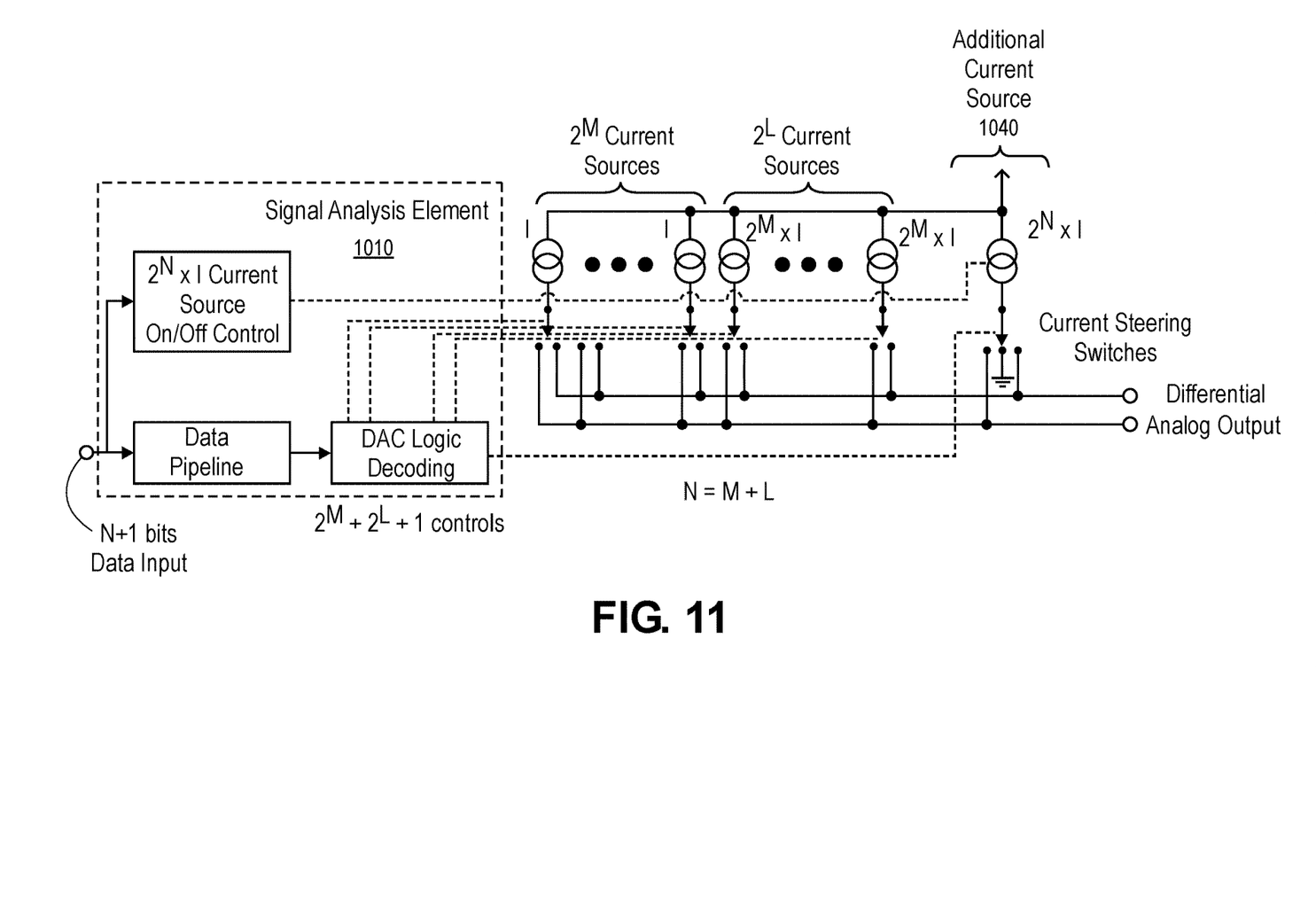
FIG. 11 is an illustration of an approach that prevents an increase in power consumption in a DAC having an increased dynamic range in accordance with an embodiment of the invention.

One adverse effect of the implementation above is an increase in the DAC power consumption due to the high current handled by the $2^N \times I$ current source. Advantageously, FIG. 11 is an illustration of an approach that prevents this increase in power consumption in a DAC having an increased dynamic range in accordance with an embodiment of the invention.

As explained above, the $2^N \times I$ current source is steered to a current sink during most of the samples, and is steered to either the positive or negative DAC outputs in low probability occurrences. To provide further power consumption saving, an embodiment may utilize an on/off control for the $2^N \times I$ current source. In this embodiment, the $2^N \times I$ current source in the DAC is normally turned off while a digital signal value smaller than the original DAC full scale (half the full scale of the improved DAC) is provided to the DAC. Several samples before a large PAPR peak arrives at the DAC requiring the output of the $2^N \times I$ current source, that current source is turned on, while the current steering switch directs its current to the sink. When the actual large PAPR peak sample arrives at the DAC, the $2^N \times I$ current source had sufficient time to turn on and stabilize to its desired current level, and the $2^N \times I$ current steering switch directs the current to the desired DAC output. After the DAC input goes back to lower amplitude, the $2^N \times I$ current steering switch directs the $2^N \times I$ current source back to the sink, and the $2^N \times I$ current source is turned off again. The on/off DAC operation requires a small delay pipeline of several samples to allow it to observe the "future" data samples so it can start turning the $2^N \times I$ current source on in advance. This approach allows significant saving in power consumption since the $2^N \times I$ current source, which require a large portion of the DAC consumed power, can be off most of the time. For example, if the $2^N \times I$ current source is turned on 8 samples before a large amplitude sample and a single sample after that large amplitude sample, and for a signal with a large amplitude probability of $10^{-3}$, the $2^N \times I$ current source is on only 1% of the time.

Figure 12:
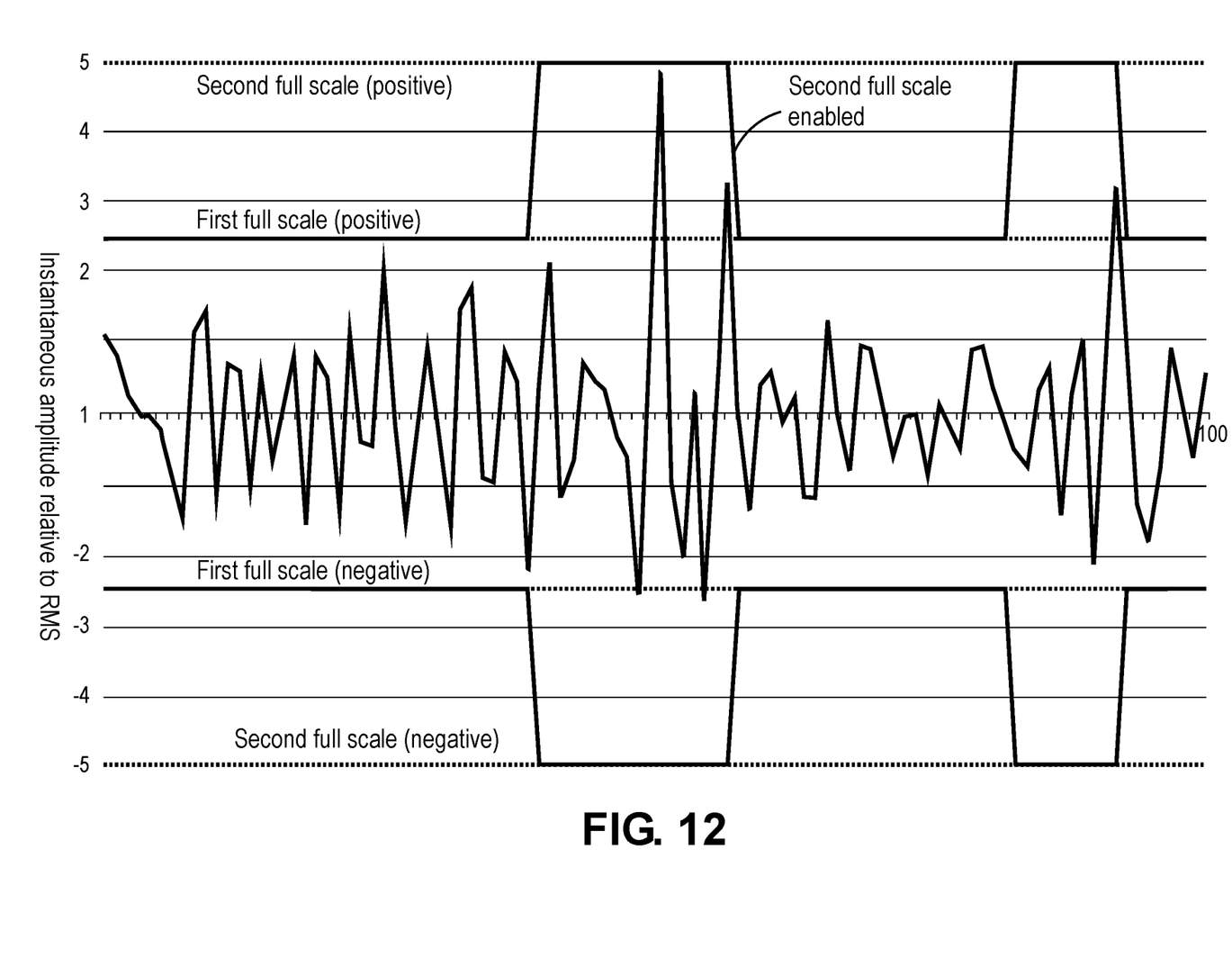
FIG. 12 illustrates a plot of a large PAPR signal provided to the DAC in accordance with an embodiment of the invention.

FIG. 12 is a plot of a large PAPR signal provided to the DAC in accordance with an embodiment of the invention. FIG. 12 shows that the $2^N \times I$ current source is turned several samples before a large amplitude peak arrives at the DAC and turned off immediately thereafter, enabling 2× full scale signal to be processed by the DAC.

Since the $2^N \times I$ current source is substantially larger than all other current sources, and since this current source is switched on/off as needed according to high PAPR peak instantaneous events, it may affect the actual current provided by all other (smaller) current sources, thus adversely affecting the overall DAC linearity. Although these adverse effects happen in very low probability (e.g., $10^{-3}$), it is still desirable to decouple as much as possible the on/off switching and current steering operation of the $2^N \times I$ current source from the operation of the other current sources. One main way in which the adverse phenomenon can materialize is through the voltage supply rails of the current sources. Specifically, the very high current of the $2^N \times I$ current source has to be supplied by the DAC voltage rails, and turning that current source on or off may produce negative and/or positive spikes in that voltage rail.

Figure 13:
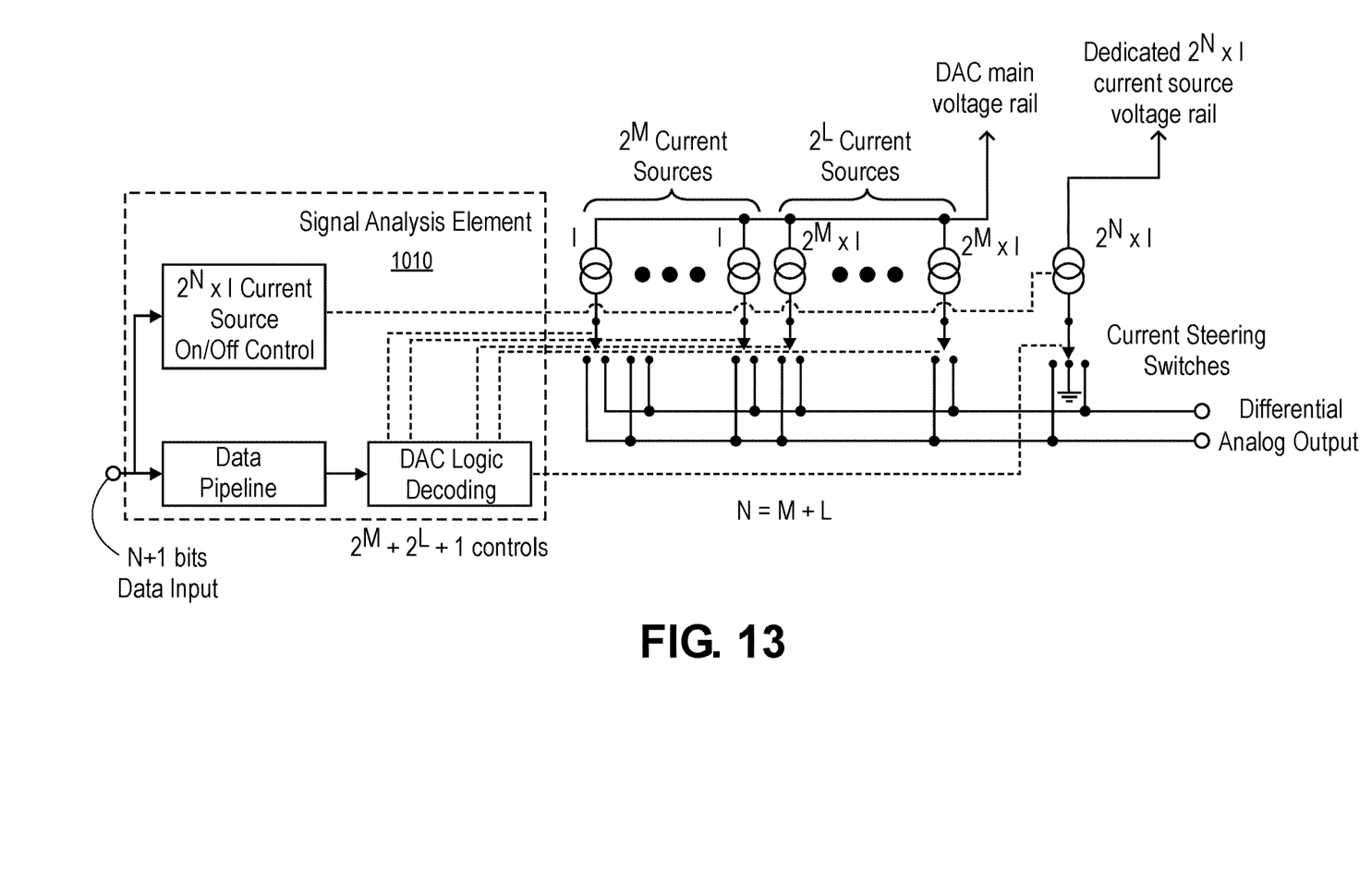
FIG. 13 depicts an approach that employs a dedicated voltage rail for the additional current source in a DAC having an increased dynamic range in accordance with an embodiment of the invention.

FIG. 13 is an illustration of an approach that employs voltage rails with a DAC having an increased dynamic range in accordance with an embodiment of the invention. Several methods can be employed to reduce the effect on the DAC voltage supply rails. The switching on/off operation can be implemented as a gradual switching, i.e., gradually ramping the current of the $2^N \times I$ current source from zero to $2^N \times I$ and from $2^N \times I$ to zero over several DAC sample times. This may substantially reduce voltage spikes created on the voltage supply rails. In another independent approach, a dedicated supply rail may be provided for the operation of the $2^N \times I$ current source, such that its on/off operation will have minimal effect on the DAC main voltage rail, and through it on the other current sources.

Figure 14:
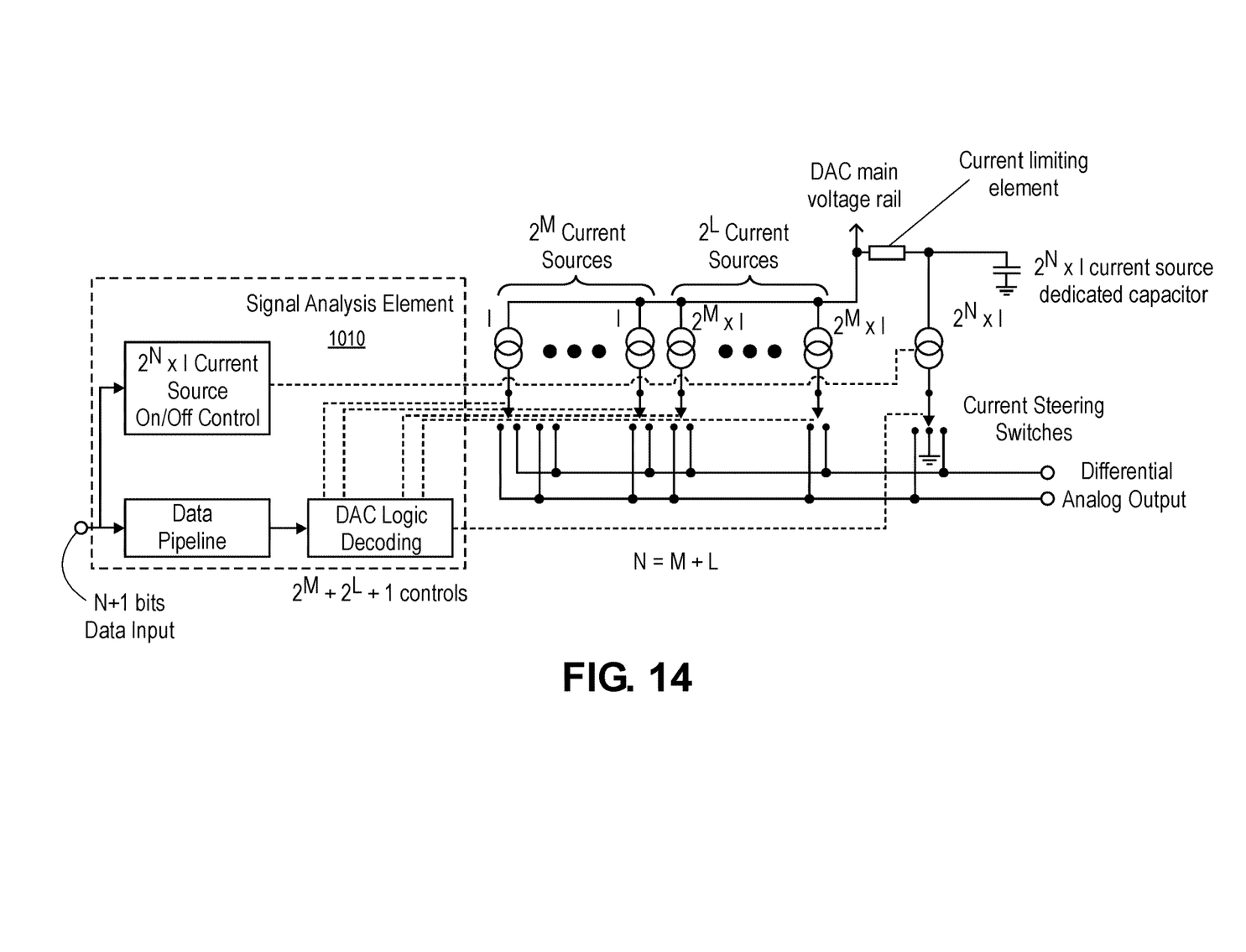
FIG. 14 depicts another approach that employs a separate voltage rail and a current limiting element for the additional current source in a DAC having an increased dynamic range in accordance with an embodiment of the invention.

FIG. 14 is an illustration of another approach that employs voltage rails with a DAC having an increased dynamic range in accordance with an embodiment of the invention. As shown in FIG. 14, one or more dedicated energy storage capacitors are positioned on the internal DAC voltage rail feeding the $2^N \times I$ current source, thereby allowing the one or more capacitors to provide a substantial portion of the $2^N \times I$ current source's current when the current source is turned on. A deliberate series resistance is positioned between the one or more capacitors and the DAC main voltage rail to further reduce adverse effects of the $2^N \times I$ current source switching on the main DAC voltage rail while allowing the capacitor(s) to recharge between the time instances when the $2^N \times I$ current source is turned on. Embodiments may use, in lieu or in addition to the deliberate series resistance, other current limiting methods to reduce adverse effects of the $2^N \times I$ current source switching on the main DAC voltage rail.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An apparatus for increasing a dynamic range of a digital to analog converter (DAC), where the DAC is capable of a first full scale value, comprising:
   a signal analysis element positioned prior to the digital to analog converter (DAC) in a processing path evaluating an instantaneous amplitude of a signal to be applied to the DAC, and
   an additional current source that supports a second full scale value of the DAC, wherein the second full scale value of the DAC is greater than the first full scale value of the DAC;
   upon the signal analysis element determining that a condition is not satisfied, the signal analysis element employing current steering to couple said additional current source to a current sink; and
   upon the signal analysis element determining that said condition is satisfied, the signal analysis element employing current steering to couple said additional current source to an output of the DAC to support the second full scale value of the DAC.

2. The apparatus of claim 1, wherein said signal analysis element is positioned within a communications device.

3. The apparatus of claim 1, wherein said signal analysis element assesses said condition using solely hardware mechanisms without software.

4. The apparatus of claim 1, wherein said signal analysis element assesses said condition using, at least in part, software that executes upon one or more processors.

5. The apparatus of claim 1, wherein said signal analysis element assesses said condition by evaluating a probability pertaining to a peak to average power (PAPR) of said instantaneous amplitude.

6. The apparatus of claim 1, wherein said condition is identified to said signal analysis element by configuring said signal analysis element.

7. The apparatus of claim 1, wherein said signal analysis element comprises a peak to average power (PAPR) detector.

8. The apparatus of claim 1, wherein said condition corresponds to a signal sample possessing an absolute value which exceeds the first full scale value of the DAC.

9. The apparatus of claim 1, wherein the second full scale value of the DAC is about twice the magnitude of the first full scale value of the DAC.

10. The apparatus of claim 1, wherein said signal analysis element evaluates a plurality of threshold conditions pertaining to said instantaneous amplitude of the signal to be applied to the DAC, and wherein said signal analysis element powers on a plurality of additional current sources according to results of said evaluation of said plurality of threshold conditions.

11. The apparatus of claim 1, wherein said DAC employs a current diversion switch to allow current from said additional current source to be connected to one of a positive output, a negative output, or a current sink of said DAC.

12. The apparatus of claim 1, wherein said additional current source is coupled to a dedicated supply rail separate from a voltage supply rail coupled to said DAC.

13. The apparatus of claim 1, wherein said additional current source is powered on several samples before a sample in said signal for which said condition is satisfied arrives at said DAC, and is powered off immediately thereafter or several samples after said signal's sample arrival.

14. The apparatus of claim 1, wherein powering-on the additional current source comprises gradually ramping up current supplied by the additional current source over several DAC samples times.

15. The apparatus of claim 1, wherein said additional current source is coupled to a dedicated energy storage capacitor that provides a substantial portion of the current supplied to said additional current source when said additional current source is powered on.

16. The apparatus of claim 1, wherein a current limiting element exists between said additional current source coupled to an energy storage capacitor and a voltage supply rail.

17. A method for increasing a dynamic range of a digital to analog converter (DAC) that is capable of a first full scale value, comprising:
    a signal analysis element, positioned prior to the digital to analog converter (DAC) in a processing path, evaluating an instantaneous amplitude of a signal to be applied to the DAC, and
    an additional current source supporting a second full scale value of the DAC, wherein the second full scale value of the DAC is greater than the first full scale value of the DAC;

upon the signal analysis element determining that a condition is not satisfied, the signal analysis element employing current steering to couple said additional current source to a current sink; and upon the signal analysis element determining that said condition is satisfied, the signal analysis element employing current steering to couple said additional current source to an output of the DAC to support the second full scale value of the DAC.

18. The method of claim 17, wherein said condition corresponds to a signal sample possessing an absolute value which exceeds the first full scale value of the DAC.

19. The method of claim 17, further comprising:

the DAC employing a current diversion switch to switch current from said additional current source to be connected to one of a positive output, a negative output, or a current sink of said DAC.

20. One or more non-transitory computer-readable storage mediums storing one or more sequences of instructions for increasing a dynamic range of a digital to analog converter (DAC) that is capable of a first full scale value, which when executed by one or more processors, cause:

a signal analysis element, positioned prior to the digital to analog converter (DAC) in a processing path, evaluating an instantaneous amplitude of a signal to be applied to the DAC, and an additional current source supporting a second full scale value of the DAC, wherein the second full scale value of the DAC is greater than the first full scale value of the DAC;

upon the signal analysis element determining that a condition is not satisfied, the signal analysis element employing current steering to couple said additional current source to a current sink; and upon the signal analysis element determining that said condition is satisfied, the signal analysis element employing current steering to couple said additional current source to an output of the DAC to support the second full scale value of the DAC.

* * * * *